(12) United States Patent
Osada et al.

(10) Patent No.: US 9,045,823 B2
(45) Date of Patent: Jun. 2, 2015

(54) SINTERED OXIDE COMPACT TARGET FOR SPUTTERING AND PROCESS FOR PRODUCING THE SAME

(75) Inventors: Kozo Osada, Ibaraki (JP); Hiroaki Ohtsuka, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 790 days.

(21) Appl. No.: 12/864,553

(22) PCT Filed: Jun. 5, 2009

(86) PCT No.: PCT/JP2009/060324
§ 371 (c)(1),
(2), (4) Date: Jul. 26, 2010

(87) PCT Pub. No.: WO2009/151003
PCT Pub. Date: Dec. 17, 2009

(65) Prior Publication Data
US 2010/0300878 A1    Dec. 2, 2010

(30) Foreign Application Priority Data

Jun. 10, 2008 (JP) .................... 2008-152103

(51) Int. Cl.
*H01B 1/02* (2006.01)
*C23C 14/34* (2006.01)
(Continued)

(52) U.S. Cl.
CPC ............. *C23C 14/3414* (2013.01); *H01B 1/08* (2013.01); *C04B 35/453* (2013.01); *C04B 35/6261* (2013.01); *C04B 35/62655* (2013.01); *C04B 35/62675* (2013.01); *C04B 35/63416* (2013.01); *C04B 2235/3284* (2013.01);
(Continued)

(58) Field of Classification Search
CPC ......................................................... H01B 1/08
USPC ....................................................... 252/519.5
See application file for complete search history.

(56) References Cited

U.S. PATENT DOCUMENTS

| 5,622,653 A | 4/1997 | Orita et al. |
| 6,106,681 A | 8/2000 | Saito et al. |

(Continued)

FOREIGN PATENT DOCUMENTS

| JP | 2006-165527 A | 6/2006 |
| JP | 2007-073312 A | 3/2007 |

(Continued)

*Primary Examiner* — Mark Kopec
*Assistant Examiner* — William Young
(74) *Attorney, Agent, or Firm* — Howson & Howson LLP

(57) ABSTRACT

Provided is a sintered oxide compact target for sputtering comprising indium (In), gallium (Ga), zinc (Zn), oxygen (O) and unavoidable impurities, wherein the composition ratio of the respective elements satisfies the Formula of $In_xGa_yZn_zO_a$ {wherein $0.2 \leq x/(x+y) \leq 0.8$, $0.1 \leq z/(x+y+z) \leq 0.5$, $a=(3/2)x+(3/2)y+z$}, and the number of $ZnGa_2O_4$ spinel phases having a grain size of 3 μm or larger existing in a 90 μm×90 μm area range of the sintered oxide compact target is 10 or less. With this sintered oxide compact target for sputtering comprising In, Ga, Zn, O and unavoidable impurities, the structure of the sintered compact target is improved, the formation of a phase to become the source of nodules is minimized, and the bulk resistance value is reduced. Whereby provided is a high density IGZO target capable of inhibiting abnormal discharge and which can be used in DC sputtering.

5 Claims, 7 Drawing Sheets

(51) Int. Cl.
  *C04B 35/453* (2006.01)
  *C04B 35/626* (2006.01)
  *C04B 35/634* (2006.01)
  *C23C 14/08* (2006.01)
  *H01B 1/08* (2006.01)

(52) U.S. Cl.
  CPC ............ C04B 2235/3286 (2013.01); C04B 2235/5409 (2013.01); C04B 2235/5436 (2013.01); C04B 2235/5445 (2013.01); C04B 2235/604 (2013.01); C04B 2235/656 (2013.01); C04B 2235/6585 (2013.01); C04B 2235/77 (2013.01); C04B 2235/786 (2013.01); C04B 2235/80 (2013.01); C23C 14/086 (2013.01)

(56) References Cited

U.S. PATENT DOCUMENTS

| | | | |
|---|---|---|---|
| 6,528,442 | B1 | 3/2003 | Kuwano et al. |
| 6,669,830 | B1 * | 12/2003 | Inoue et al. ............ 204/298.13 |
| 6,929,772 | B2 | 8/2005 | Yanai et al. |
| 7,008,519 | B2 | 3/2006 | Takahashi et al. |
| 7,061,014 | B2 | 6/2006 | Hosono et al. |
| 7,453,065 | B2 | 11/2008 | Saito et al. |
| 7,504,351 | B2 | 3/2009 | Kurihara |
| 7,601,984 | B2 * | 10/2009 | Sano et al. ............ 257/57 |
| 7,674,404 | B2 | 3/2010 | Osada |
| 7,682,529 | B2 | 3/2010 | Osada |
| 7,686,985 | B2 | 3/2010 | Osada |
| 7,699,965 | B2 | 4/2010 | Ikisawa et al. |
| 8,148,245 | B2 | 4/2012 | Ikisawa et al. |
| 2004/0180217 | A1 * | 9/2004 | Inoue et al. ............ 428/432 |
| 2004/0222089 | A1 | 11/2004 | Inoue et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2007/0194379 | A1 | 8/2007 | Hosono et al. |
| 2008/0290286 | A1 | 11/2008 | Saito et al. |
| 2008/0308774 | A1 | 12/2008 | Inoue et al. |
| 2009/0179199 | A1 | 7/2009 | Sano et al. |
| 2009/0200525 | A1 | 8/2009 | Ikisawa et al. |
| 2010/0108502 | A1 * | 5/2010 | Inoue et al. ............ 204/298.13 |
| 2010/0140570 | A1 | 6/2010 | Ikisawa et al. |
| 2012/0103804 | A1 | 5/2012 | Ikisawa et al. |

FOREIGN PATENT DOCUMENTS

| | | |
|---|---|---|
| JP | 2007-223849 A | 9/2007 |
| WO | 2008/072486 A1 | 6/2008 |
| WO | 2008072486 * | 6/2008 |

* cited by examiner

SINTERED OXIDE COMPACT TARGET FOR SPUTTERING AND PROCESS FOR PRODUCING THE SAME

BACKGROUND OF THE INVENTION

The present invention relates to a sintered oxide compact target for use in sputtering comprising indium (In), gallium (Ga), zinc (Zn), oxygen (O) and unavoidable impurities (generally referred to as "IGZO"; whereby the ensuing explanation will be provided by referring to the term "IGZO" as needed) and its production method.

Generally, a thin film transistor known as TFT (Thin Film Transistor) is formed from a three-terminal device including a gate terminal, a source terminal, and a drain terminal. With this kind of device, a semiconductor thin film formed on a substrate is used as a channel layer in which electrons or positive holes are moved, and voltage is applied to the gate terminal in order to control the current flowing in the channel layer, whereby provided is a function for switching the current that is flowing between the source terminal and the drain terminal. The device that has been most widely used in recent years is the type that uses a polycrystalline silicon film or an amorphous silicon film as the channel layer.

Nevertheless, since a silicon series material (polycrystalline silicon or amorphous silicon) absorbs light in a visual light range, there is a problem in that the thin film transistor will malfunction due to a carrier caused by the optical incidence. Although a light shielding layer formed of metal or the like is provided as a preventive measure, there is a problem in that the aperture ratio will decrease. Also, higher brightness of the backlight is required in order to maintain the screen brightness, and there are drawbacks such as the increase of power consumption.

Moreover, even with the deposition of amorphous silicon, which is known to be producible with a lower temperature than polycrystalline silicon in the preparation of the foregoing silicon series materials, a high temperature of approximately 200° C. or higher is required. Accordingly, with this kind of temperature, since it is not possible to use a polymer film having the advantages of being inexpensive, lightweight and flexible as the base material, there is a problem in that the range of options for the substrate material is limited. Further, there are drawbacks in terms of productivity since the process of producing devices at high temperatures requires high energy-cost and much time for the heating process.

In light of the above, a thin film transistor using a transparent oxide semiconductor in substitute for a silicon material is being developed in recent years. A typical material is the In—Ga—Zn—O (IGZO) series material. Proposals have been made for applying this material for use in a field-effect transistor since it is possible to obtain amorphous oxide in which the electronic carrier concentration is less than $10^{18}/cm^3$ (refer to Patent Document 1).

In addition, various proposals have been made for using the oxide of this system in a field-effect transistor (refer to Patent Document 2, Patent Document 3, Patent Document 4, Patent Document 5, Patent Document 6, Patent Document 7, Patent Document 8 and Patent Document 9).

Although Patent Document 1 suggests that the sputtering method is optimal for the deposition of amorphous oxide, Examples 1 to 12 of Patent Document 1 only show cases of performing deposition based on the pulse laser deposition method (PLD method), and only one case performs radio frequency (RF) sputtering. Similarly, Patent Documents 2 to 9 just disclose the characteristics of a field-effect transistor or describe performing reactive epitaxial method or the pulse laser deposition method as the deposition method, and none of the foregoing Patent Documents suggest performing direct current (DC) sputtering with a high deposition rate as the sputtering method.

The direct current (DC) sputtering method requires a target, but an In—Ga—Zn—O (IGZO) series oxide target is not easily manufactured.

The reason for this is that the components are a multicomponent series, and the In—Ga—Zn—O (IGZO) series oxide target entails numerous problems; specifically, it is affected by the characteristics and condition of the powder since it is produced by mixing the respective oxide powders, the characteristics of the sintered compact will differ depending on the sintering conditions, the conductivity may be lost depending on the sintering conditions and component composition, and nodules and abnormal discharge may occur during the sputtering process depending on the characteristics and condition of the target.

In light of the above, the Applicant has previously proposed an invention for inhibiting the generation of nodules and abnormal discharge during the sputtering process. This invention is an improvement of the foregoing inventions.

[Patent Document 1] WO2005/088726A1
[Patent Document 2] Japanese Patent Laid-Open Publication No. 2004-103957
[Patent Document 3] Japanese Patent Laid-Open Publication No. 2006-165527
[Patent Document 4] Japanese Patent Laid-Open Publication No. 2006-165528
[Patent Document 5] Japanese Patent Laid-Open Publication No. 2006-165529
[Patent Document 6] Japanese Patent Laid-Open Publication No. 2006-165530
[Patent Document 7] Japanese Patent Laid-Open Publication No. 2006-165532
[Patent Document 8] Japanese Patent Laid-Open Publication No. 2006-173580
[Patent Document 9] Japanese Patent Laid-Open Publication No. 2006-186319
[Patent Document 10] Japanese Patent Application No. 2007-336398

SUMMARY OF THE INVENTION

Thus, an object of the present invention is to provide a sintered oxide compact target for use in sputtering comprising indium (In), gallium (Ga), zinc (Zn), oxygen (O) and unavoidable impurities, wherein the structure of the sintered compact target is improved, the formation of a phase to become the source of nodules is minimized, and the bulk resistance value is reduced. Also provided is a high density IGZO target capable of inhibiting abnormal discharge and can be used in DC sputtering.

As a result of intense study to achieve the foregoing object, the present inventors discovered that reducing the spinel phases in the target structure of the IGZO target is extremely effective.

Based on the foregoing discovery, the present invention provides: 1) A sintered oxide compact target for sputtering comprising indium (In), gallium (Ga), zinc (Zn), oxygen (O) and unavoidable impurities, wherein the composition ratio of the respective elements satisfies the Formula of $In_xGa_yZn_zO_a$ {wherein $0.2 \le x/(x+y) \le 0.8$, $0.1 \le z/(x+y+z) \le 0.5$, $a=(3/2)x+(3/2)y+z$}, and the number of $ZnGa_2O_4$ spinel phases having a grain size of 3 μm or larger existing in a 90 μm×90 μm area range of the sintered oxide compact target is 10 or less; 2) The sintered oxide compact target for sputtering according to paragraph 1) above, wherein the maximum grain size of the $ZnGa_2O_4$ spinel phases existing in a 90 μm×90 μm area range of the sintered oxide compact target is 5 μm or less; and 3) The sintered oxide compact target for sputtering according to paragraph 1) or paragraph 2) above, wherein the target density is 6.0 g/cm$^3$ or more, and the bulk resistance value is 5.0.×10$^{-2}$ Ω·cm or less.

The present invention additionally provides:

4) A method of producing a sintered oxide compact target for sputtering comprising indium (In), gallium (Ga), zinc (Zn), oxygen (O) and unavoidable impurities, wherein raw material powders of indium oxide ($In_2O_3$), gallium oxide ($Ga_2O_3$), and zinc oxide (ZnO) are adjusted so that the composition ratio of the respective elements will become the Formula of $In_xGa_yZn_zO_a$ {wherein $0.2 \le x/(x+y) \le 0.8$, $0.1 \le z/(x+y+z) \le 0.5$, $a=(3/2)x+(3/2)y+z$}, the specific surface area of the $In_2O_3$ raw material powder is set to be 10 m$^2$/g or less, the raw material powders are mixed and additionally pulverized, and thereafter sintered at a temperature range of 1400 to 1490° C.; and 5) The method of producing a sintered oxide compact target for sputtering according to paragraph 4) above, wherein, during the processing of mixing and pulverizing the raw material powders of $In_2O_3$, $Ga_2O_3$ and ZnO, pulverization is performed until the difference in specific surface area before and after pulverization becomes 2.0 m$^2$/g or more.

According to the above, as a result of keeping the number of $ZnGa_2O_4$ spinel phases having a grain size of 3 μm or larger existing in the structure of the In—Ga—Zn—O series sputtering sintered compact target to be 10 or less, it is possible to reduce the generation of nodules, and the occurrence of abnormal discharge that is caused by the nodules considerably. Also, since the bulk resistance value can also be lowered, DC sputtering can be performed easily, and superior effects of achieving high density and stable deposition are yielded.

DETAILED DESCRIPTION OF THE INVENTION

Figure 1:
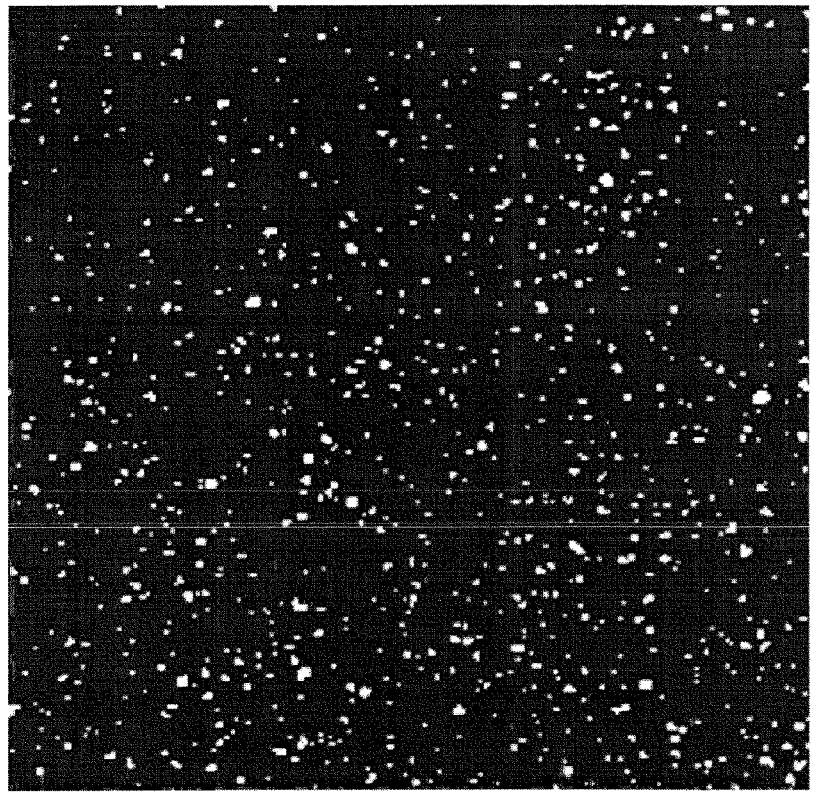
FIG. 1 a microstructure photograph of a target test piece shown in Example 1

The sputtering target of the present invention is a sintered oxide compact comprising In, Ga, Zn, O and unavoidable impurities, and the composition ratio of the respective elements satisfies the following Formula of $In_xGa_yZn_zO_a$ {wherein $0.2 \le x/(x+y) \le 0.8$, $0.1 \le z/(x+y+z) \le 0.5$, $a=(3/2)x+(3/2)y+z$}. If the In ratio is increased, the carrier concentration of the sputtered film tends to increase, but if it is too high, then the device characteristics (on/off ratio) will deteriorate. In addition, if the In ratio is lower than the lower limit, this is not preferable since the mobility of the film will decrease and the device characteristics will deteriorate. If the Ga ratio is increased, the carrier concentration of the film tends to decrease. Since In and Ga opposite effects of mutually increasing and decreasing, it is optimal to keep the ratios within the foregoing range.

Since the composition ratio of the target will be directly reflected on the sputter deposition, it is essential to adjust the composition ratio of the target in order to maintain the characteristics of the film.

Next, with respect to the Zn ratio, if Zn becomes greater than the foregoing numerical value, this is not preferable since the stability and moisture resistance of the film will deteriorate. Meanwhile, if the Zn content becomes less than the foregoing numerical value, this is not preferable since the amorphous nature of the sputtered film will deteriorate and crystallization will occur. Accordingly, the Zn ratio is set to be within the foregoing range. Moreover, the oxygen content is decided based on the balance of In, Ga, and Zn, but a stable amorphous state can be obtained based on $a=(3/2)x+(3/2)y+z$.

The component composition required by the foregoing IGZO thin film is the composition required to use a transparent oxide semiconductor mainly as a thin film transistor and it can be said that it is a publicly known component composition.

The problem here is the generation of nodules caused by an abnormal discharge in the sputtering target having the foregoing component composition. This abnormal discharge causes the generation of foreign material in the sputtered film, and causes the film characteristics to deteriorate. Thus, it was necessary to determine the cause of such generation of nodules in the IGZO target.

Although the present invention relates to an IGZO sintered compact target, as described later in the Examples and Comparative Examples, minute granular structures can be seen in the uniform structure. It has been discovered that such granular structures are the $ZnGa_2O_4$ spinel phase. There is no particular problem in a state where such granular structures are finely dispersed. However, it has been discovered that as the granular structures become larger, and at a certain point, the particles become the source that causes the generation of nodules.

In addition, an abnormal discharge will easily occur with the generation of nodules as the source. In light of the above, it is necessary to finely disperse the $ZnGa_2O_4$ spinel phase, and it has been ascertained that the quantitative limitation thereof is able to effectively inhibit the generation of nodules.

The present invention was devised based on the foregoing discovery, and the number of $ZnGa_2O_4$ spinel phases having a grain size of 3 μm or larger existing in a 90 μm×90 μm area range of the sintered oxide compact target is 10 or less. The sintered oxide compact target for sputtering that was adjusted as described is able to inhibit the generation of nodules, and reduce the abnormal discharge with the nodules as the source. This is the most effective means for inhibiting the generation of nodules. If the number of $ZnGa_2O_4$ spinel phases exceeds 10, the generation of nodules will increase, and the abnormal discharge will proportionately increase, which causes the quality of the film to deteriorate. It is also effective if the maximum grain size of the $ZnGa_2O_4$ spinel phases existing in a 90 μm×90 μm area range of the sintered oxide compact target is 5 μm or less, and the present invention also provides this kind of sintered oxide compact target for sputtering.

One of the goals of the present invention is to obtain a conductive target, and it is necessary to reduce the bulk resistance value to achieve the goal. If the number of $ZnGa_2O_4$ spinel phases increases, the bulk resistance value tends to increase. The present invention is able to achieve a bulk resistance value of $5.0 \times 10^{-2} \Omega \cdot cm$ or less. This is a condition which allows DC sputtering to be performed easily, and is a major feature of usefulness of the present invention. For stable sputtering, it is desirable to achieve the highest target density possible, and the present invention is able to achieve a target density of $6.0 \text{ g/cm}^3$ or higher.

Moreover, the sintered oxide compact target for sputtering of the present invention is produced such that raw material powders of indium oxide ($In_2O_3$), gallium oxide ($Ga_2O_3$), and zinc oxide (ZnO) are adjusted so that the composition ratio of the respective elements will become the following Formula of $In_xGa_yZn_zO_a$ {wherein $0.2 \leq x/(x+y) \leq 0.8$, $0.1 \leq z/(x+y+z) \leq 0.5$, $a=(3/2)x+(3/2)y+z$}, the specific surface area of the $In_2O_3$ raw material powder is set to be 10 $m^2/g$ or less, the raw material powders are mixed and additionally pulverized, and thereafter sintered at a temperature range of 1400 to 1490° C.

Upon making the number of $ZnGa_2O_4$ spinel phases having a grain size of 3 μm or larger existing in a 90 μm×90 μm area range of the sintered oxide compact target to be 10 or less, $In_2O_3$ raw material powder having a specific surface area of 10 $m^2/g$ or less is used. The raw material powders of indium oxide ($In_2O_3$), gallium oxide ($Ga_2O_3$), and zinc oxide (ZnO) are all mixed as one and subsequently pulverized. However, only the $In_2O_3$ raw material powder prior to mixing needs to be careful so as to have a specific surface area of 10 $m^2/g$ or less at the raw material stage. Upon mixing and pulverizing the powders, the grain size and specific surface area of the $In_2O_3$ raw material powder will become the index. It is considered that the generation of the $ZnGa_2O_4$ spinel phase can be effectively prevented because, in the course of the $In_2O_3$ raw material powder having a relatively large grain size and a small specific surface area being pulverized, $In_2O_3$ infiltrates other oxides, and sufficient mixing and pulverization is achieved.

Moreover, in the course of mixing and pulverizing the raw material powders of $In_2O_3$, $Ga_2O_3$ and ZnO, it is even more effective if pulverization is performed until the difference in specific surface area before and after pulverization becomes 2.0 $m^2/g$ or more. This signifies that the three types of raw material powders will be sufficiently pulverized and mixed.

Furthermore, with respect to the sintering temperature, preferably it is in a range of 1400 to 1490° C. If it is less than 1400° C., the sintering will be insufficient, and the sintered density will not improve. If it exceeds 1490° C., ZnO will be formed in the structure, and the density will similarly decrease. Thus, the foregoing temperature range is preferable.

A typical example of the production process of the foregoing sintered oxide compact according to the present invention is as follows.

As the raw material, indium oxide ($In_2O_3$), gallium oxide ($Ga_2O_3$), and zinc oxide (ZnO) may be used. In order to avoid the adverse effect on the electrical properties caused by impurities, it is desirable to use raw materials having a purity of 4N or higher. The respective raw material powders are weighed to attain the intended composition ratio. Incidentally, as described above, the raw material powders include unavoidable impurities.

In the foregoing case, as the indium oxide ($In_2O_3$) raw material powder, raw material powder in which the specific surface area was selected at the raw material stage is used.

Mixing and pulverization are subsequently performed. If pulverization is insufficient, the respective components will segregate in the produced target, whereby high and low resistivity areas will co-exist, which eventually will cause abnormal discharge such as arcing due to electrification in the high resistivity area during the sputter deposition. Thus sufficient mixing and pulverization is necessary.

After mixing the respective raw materials with a super mixer, the raw materials are filled in an alumina sagger, and calcinated at a temperature range of 950 to 1350° C., retention time for 2 to 10 hr, and under an atmospheric environment.

Subsequently, the raw materials are pulverized for roughly 2 to 5 hr with an attriter (φ3 mm zirconia beads, agitator rotation of 300 rpm), in which, for instance, one batch is 1000 g. The level of pulverization differs in the respective Examples and Comparative Examples. For example, pulverization was performed in Comparative Example 6 and Comparative Example 8 for 1 hr, whereas in Comparative Example 7, pulverization was not performed.

Subsequently, the slurry obtained after the pulverization is dried with a hot air drying machine at 100 to 150° C. for 5 to 48 hr, and sieved with a sieve having an opening of 250 μm in order to collect the powder. The specific surface area of the respective powders is measured before and after pulverization. 20 cc of PVA aqueous solution (PVA solid content of 3%) is mixed with 1000 g of IGZO powder, and sieved with a sieve having an opening of 500 μm.

Subsequently, 1000 g of powder is filled in a φ210 mm mold, and pressed at a bearing of 400 to 1000 kgf·$cm^2$ to obtain a compact. The compact is subject to double vacuum packing using vinyl, and then to CIP at 1500 to 4000 kgf/$cm^2$. Sintering is thereafter performed at a given temperature (retention time for 5 to 24 hr under an oxygen atmosphere) to obtain a sintered compact.

Upon producing a target, the outer periphery of the sintered oxide compact obtained as above is subject to cylindrical grinding and the side face thereof is subject to surface grinding to process it into a 152.4φ×5 mmt target. This is additionally bonded to, for instance, a copper backing plate using indium alloy or the like as the bonding metal to form a sputtering target.

EXAMPLES

The present invention is now explained in detail with reference to the Examples and Comparative Examples. These Examples are merely illustrative, and the present invention shall in no way be limited thereby. In other words, various modifications and other embodiments based on the technical spirit claimed in the claims shall be included in the present invention as a matter of course.

The properties of the raw material powders that were used in the Examples and Comparative Example were as follows. $In_2O_3$ raw material (1): grain size of 10.7 μm and specific surface area of 4.4 $m^2/g$ $In_2O_3$ raw material (2): grain size of 0.65 μm and specific surface area of 13.7 m²/g $In_2O_3$ raw material (3): grain size of 1.6 μm and specific surface area of 5.8 m²/g $Ga_2O_3$ raw material (1): grain size of 5.6 μm and specific surface area of 9.1 m²/g $Ga_2O_3$ raw material (2): grain size of 4.6 μm and specific surface area of 11.9 m²/g ZnO raw material (1): grain size of 1.07 μm and specific surface area of 3.8 m²/g These raw materials were mixed so that the IGZO will be at a molar ratio of $In_2O_3:Ga_2O_3:ZnO=1:1:1$, and targets were prepared and various tests were conducted by changing the combination of the foregoing raw materials and their production conditions of pulverization, calcination temperature and sintering temperature. The details are shown in the Examples and Comparative Examples.

The foregoing compounding ratio (1:1:1) is a typical compounding ratio of the IGZO target. In order to prevent the generation of nodules of the target as intended by the present invention, although there is no particular limitation regarding the IGZO compounding ratio, the raw materials were mixed so as to achieve $In_2O_3:Ga_2O_3:ZnO=1:1:2$ in Example 6 and Example 7.

Various measurements and evaluations are required in the following Examples and Comparative Examples, and the conditions thereof were as follows.

(Measurement of Grain Size)

The grain size was measured using a particle size distribution analyzer (Microtrac MT3000 manufactured by Nikkiso Co., Ltd.).

(Measurement of Specific Surface Area)

The specific surface area (BET) was measured using the BETA-SOAP auto surface measuring apparatus (MODEL-4200 manufactured by Nikkiso Co., Ltd.).

(Image Analysis and Structure Evaluation)

The test pieces of the prepared targets were polished with a polishing machine until achieving a mirror surface. Subsequently, the test pieces were subject to area analysis using FE-EPMA (manufactured by JEOL Ltd., JXA-8500F electron probe micro analyzer) under the following conditions: accelerating voltage of the electron gun was 15 (kV) and illumination current was approximately $2.0 \times 10^{-7}$ (A). Consequently, the respective elements of In, Zn, Ga, O were detected and mapped under the conditions shown in Table 1 below.

The mapping image (RGB color image) of the area analysis was 256×256 pixels, and the measurement time of the respective pixels was 10 μs. For instance, the red component was separated from the obtained Ga mapping image (threshold value was set at 100), and the grain size (maximum distance between the parallel tangent lines of the particles) was measured and number of grains (particles of 3 μm or larger) was counted. As the image processing software, analySIS ver.5 (manufactured by Soft Imaging System GmbH) was used.

(Sputtering Conditions)

The test pieces of the prepared targets were sputtered under the conditions shown in Table 2, and the generation of nodules was observed visually.

TABLE 1

| | Dispersive crystal | Dispersive wavelength (nm) |
|---|---|---|
| O | LDE1 | 2.3293 |
| Ga | TAPH | 1.1292 |

TABLE 1-continued

| | Dispersive crystal | Dispersive wavelength (nm) |
|---|---|---|
| In | PETH | 0.3555 |
| Zn | LIFH | 0.1433 |

TABLE 2

| Sputter gas | Ar: 100% |
|---|---|
| Sputter gas pressure | 0.5 Pa |
| Input power | 500 W |
| Amount of input power | 20 kWh |
| Substrate temperature | Room temperature |

Example 1

In Example 1, the foregoing $In_2O_3$ powder (1) having a grain size of 10.7 μm and a specific surface area of 4.4 m²/g was used as the $In_2O_3$ raw material, the foregoing $Ga_2O_3$ powder (2) having a grain size of 4.6 μm and a specific surface area 11.9 m²/g was used as the $Ga_2O_3$ raw material, and the foregoing ZnO powder (1) having a grain size of 1.07 μm and a specific surface area of 3.8 m²/g was used as the ZnO raw material. The raw materials were mixed so that these powders will be at a molar ratio of $In_2O_3:Ga_2O_3:ZnO=1:1:1$.

Subsequently, these powders were mixed, and additionally calcinated in the atmosphere at 950° C. for 5 hours. The specific surface area (BET) before and after pulverization was 3.1 m²/g and 14.7 m²/g, respectively. Thus, the difference was 11.6 m²/g.

The foregoing results are collectively shown in Table 3. The powder mixing, pulverization, calcination, sintering, and target production were conducted based on the conditions shown in foregoing paragraph [0021] and paragraph [0022]. Here, the main conditions are shown, and the various measurements and evaluations were conducted according to the methods described in foregoing paragraphs [0026] to [0029].

Sintering was performed at 1450° C. As a result of the above, in Example 1, the maximum size of the $ZnGa_2O_4$ spinel phase (maximum grain size of the spinel phase) existing in a 90 μm×90 μm area range was less than 3 μm, and the number of $ZnGa_2O_4$ spinel phases having a grain size of 3 μm or larger was 0. These results satisfied the conditions of the present invention. The density was high at 6.26 g/cm³, and the bulk resistance value was 6.0 mΩ·cm; the bulk resistance value of the target was low enough to be subject to DC sputtering. By performing DC sputtering under the foregoing conditions, the number of nodules was 222, and it was less than half compared with the Comparative Examples described later. Further to this, hardly any abnormal discharge was acknowledged during the sputtering. Even though the $ZnGa_2O_4$ spinel phases existed, the fact that they were finely dispersed is considered to be the major reason that the generation of nodules was inhibited. The micrograph of this structure is in FIG. 1.

Moreover, the effect of preventing the formation of the $ZnGa_2O_4$ spinel phases in the target is a result of the effect yielded by using powder in which the specific surface area of the $In_2O_3$ raw material powder is 10 m²/g or less (specific surface area of 4.4 m²/g). In the foregoing case, this also satisfied the condition of performing pulverization until the difference in specific surface area before and after pulverization becomes 2.0 m²/g or more in the course of mixing and pulverizing the raw material powders of $In_2O_3$, $Ga_2O_3$ and ZnO.

Figure 2:
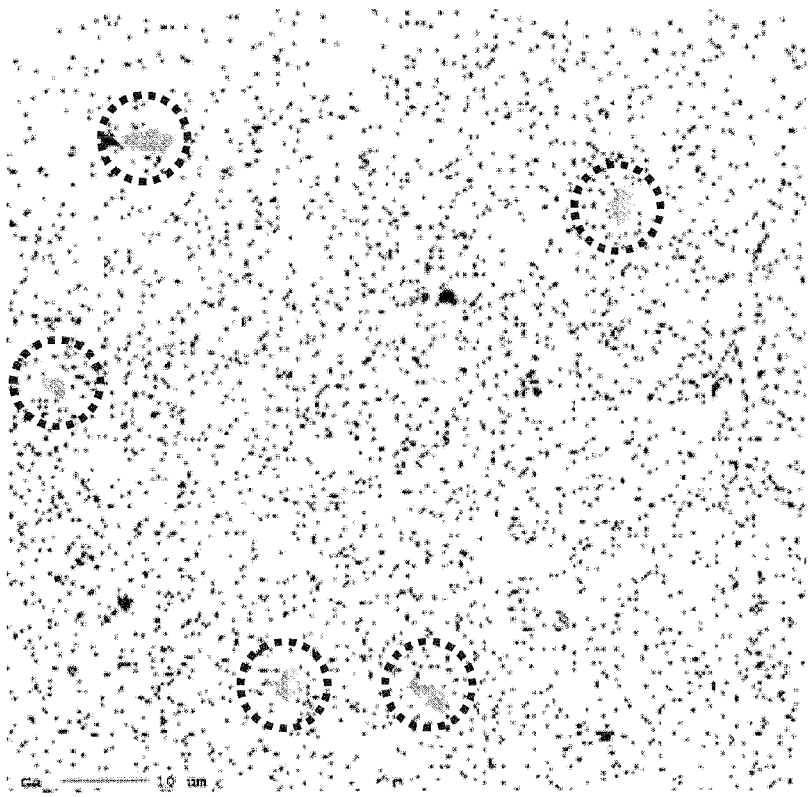
FIG. 2 a microstructure photograph of a target test piece shown in Example 2

It is considered that the generation of the $ZnGa_2O_4$ spinel phase can be effectively prevented because, in the course of the $In_2O_3$ raw material powder having a relatively large grain size and a small specific surface area being pulverized, $In_2O_3$ infiltrates other oxides, and sufficient mixing and pulverization with other oxides is achieved. This shows that the specific surface area of the $In_2O_3$ raw material powder can become the index in producing an IGZO target capable of inhibiting the generation of nodules. The foregoing results are shown in Table 3.

to be the major reason that the generation of nodules was inhibited. The micrograph of this structure is shown in FIG. 2.

Moreover, the effect of preventing the formation of the $ZnGa_2O_4$ spinel phases in the target is a result of the effect yielded by using powder in which the specific surface area of the $In_2O_3$ raw material powder is 10 $m^2/g$ or less (specific surface area of 4.4 $m^2/g$). It is considered that the generation of the $ZnGa_2O_4$ spinel phase can be effectively prevented because, in the course of the $In_2O_3$ raw material powder having a relatively large grain size and a small specific surface area being pulverized, $In_2O_3$ infiltrates other oxides, and sufficient mixing and pulverization with other oxides is achieved. This shows that the specific surface area of the $In_2O_3$ raw material powder can become the index in producing an IGZO target capable of inhibiting the generation of nodules. The foregoing results are similarly shown in Table 3.

TABLE 3

|  | Example 1 | Example 2 | Example 3 | Example 4 | Example 5 | Example 6 | Example 7 |
|---|---|---|---|---|---|---|---|
| $In_2O_3$ raw material | (1) | (1) | (3) | (3) | (1) | (1) | (1) |
| $Ga_2O_3$ raw material | (2) | (1) | (2) | (2) | (1) | (2) | (1) |
| ZnO raw material | (1) | (1) | (1) | (1) | (1) | (1) | (1) |
| Calcination temperature (° C.) | 950 | 950 | 1350 | 1350 | No calcination | 950 | 1050 |
| BET ($m^2/g$) before pulverization | 3.1 | 2.6 | 6.9 | 6.9 | 6.0 | 3.1 | 1.8 |
| BET ($m^2/g$) after | 14.7 | 17.0 | 17.1 | 17.1 | 17.8 | 14.7 | 11.5 |
| Sintering temperature (° C.) | 1450 | 1450 | 1400 | 1450 | 1450 | 1450 | 1490 |
| Maximum grain size (μm) of spinel phase | <3.0 | 4.53 | <3.0 | <3.0 | 3.71 | <3.0 | <3.0 |
| Number of spinels | 0 | 5 | 0 | 0 | 7 | 0 | 0 |
| Density ($g/cm^3$) | 6.26 | 6.22 | 6.29 | 6.36 | 6.20 | 6.14 | 6.34 |
| Bulk resistance value (mΩ · cm) | 6.0 | 2.2 | 12.0 | 4.4 | 2.97 | 29.0 | 18.0 |
| Number of nodules | 222 | 359 | 251 | 189 | 390 | 170 | 154 |

Number of spinels: Spinels in which the average grain size was less than 3 μm were counted as 0.

Example 2

In Example 2, the foregoing $In_2O_3$ powder (1) having a grain size of 10.7 μm and a specific surface area of 4.4 $m^2/g$ was used as the $In_2O_3$ raw material, the foregoing $Ga_2O_3$ powder (1) having a grain size of 5.6 μm and a specific surface area of 9.1 $m^2/g$ was used as the $Ga_2O_3$ raw material, and the foregoing ZnO powder (1) having a grain size of 1.07 μm and a specific surface area of 3.8 $m^2/g$ was used as the ZnO raw material. The raw materials were mixed so that these powders will be at a molar ratio of $In_2O_3:Ga_2O_3:ZnO=1:1:1$.

Subsequently, these powders were mixed, and additionally calcinated in the atmosphere at 950° C. for 5 hours. The specific surface area (BET) before and after pulverization was 2.6 $m^2/g$ and 17.0 $m^2/g$, respectively. Thus, the difference was 14.4 $m^2/g$.

The results are collectively shown in Table 3. The same methods as Example 1 were conducted as to the powder mixing, pulverization, calcination, sintering and target production, and various measurements and evaluations.

Sintering was performed at 1450° C. As a result of the above, in Example 2, the maximum size of the $ZnGa_2O_4$ spinel phase (maximum grain size of the spinel phase) existing in a 90 μm×90 μm area range was 4.53 μm, and the number of $ZnGa_2O_4$ spinel phases having a grain size of 3 μm or larger was 5. These results satisfied the conditions of the present invention. The density was high at 6.22 $g/cm^3$, and the bulk resistance value was 6.0 mΩ·cm; the bulk resistance value of the target was low enough to be subject to DC sputtering. As a result of performing DC sputtering under the foregoing conditions, the number of nodules was 359 and slightly higher than Example 1, but it was still roughly half compared with the Comparative Examples described later. Further to this, hardly any abnormal discharge was acknowledged during the sputtering. Even though the $ZnGa_2O_4$ spinel phases existed, the fact that they were finely dispersed is considered Example 3

In Example 3, the foregoing $In_2O_3$ powder (3) having a grain size of 1.6 μm and a specific surface area of 5.8 $m^2/g$ was used as the $In_2O_3$ raw material, the foregoing $Ga_2O_3$ powder (2) having a grain size of 5.6 μm and a specific surface area 9.1 $m^2/g$ was used as the $Ga_2O_3$ raw material, and the foregoing ZnO powder (1) having a grain size of 1.07 μm and a specific surface area 3.8 $m^2/g$ was used as the ZnO raw material. The raw materials were mixed so that these powders will be at a molar ratio of $In_2O_3:Ga_2O_3:ZnO=1:1:1$.

Subsequently, these powders were mixed, and additionally calcinated in the atmosphere at 1350° C. for 5 hours. The specific surface area (BET) before and after pulverization was 6.9 $m^2/g$ and 17.1 $m^2/g$, respectively. Thus, the difference was 10.2 $m^2/g$.

The results are collectively shown in Table 3. The same methods as Example 1 were conducted as to the powder mixing, pulverization, calcination, sintering and target production, and various measurements and evaluations.

Figure 3:
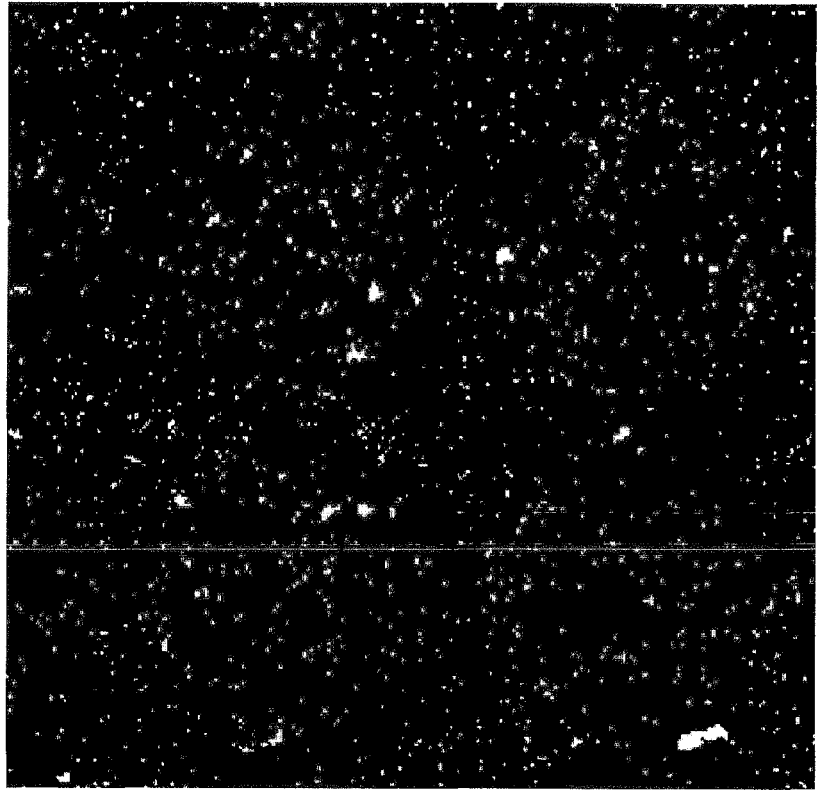
FIG. 3 a microstructure photograph of a target test piece shown in Example 3

Sintering was performed at 1400° C. As a result of the above, in Example 3, the maximum size of the $ZnGa_2O_4$ spinel phase (maximum grain size of the spinel phase) existing in a 90 μm×90 μm area range was less than 3 μm, and the number of $ZnGa_2O_4$ spinel phases having a grain size of 3 μm or larger was 0. These results satisfied the conditions of the present invention. The density was high at 6.29 $g/cm^3$, and the bulk resistance value was 12.0 mΩ·cm; the bulk resistance value of the target was low enough to be subject to DC sputtering. As a result of performing DC sputtering under the foregoing conditions, the number of nodules was 251 and slightly higher than Example 1, but it was still roughly half compared with the Comparative Examples described later. Further to this, hardly any abnormal discharge was acknowledged during the sputtering. Even though the $ZnGa_2O_4$ spinel phases existed, the fact that they were finely dispersed is considered to be the major reason that the generation of nodules was inhibited. The micrograph of this structure is shown in FIG. 3.

Moreover, the effect of preventing the formation of the $ZnGa_2O_4$ spinel phases in the target is a result of the effect yielded by using powder in which the specific surface area of the $In_2O_3$ raw material powder is 10 $m^2/g$ or less (specific surface area of 4.4 $m^2/g$). It is considered that the generation of the $ZnGa_2O_4$ spinel phase can be effectively prevented because, in the course of the $In_2O_3$ raw material powder having a relatively large grain size and a small specific surface area being pulverized, $In_2O_3$ infiltrates other oxides, and sufficient mixing and pulverization with other oxides is achieved. This shows that the specific surface area of the $In_2O_3$ raw material powder can become the index in producing an IGZO target capable of inhibiting the generation of nodules. The foregoing results are similarly shown in Table 3.

Example 4

In Example 4, the foregoing $In_2O_3$ powder (3) having a grain size of 1.6 μm and a specific surface area of 5.8 $m^2/g$ was used as the $In_2O_3$ raw material, the foregoing $Ga_2O_3$ powder (2) having a grain size of 5.6 μm and a specific surface area of 9.1 $m^2/g$ was used as the $Ga_2O_3$ raw material, and the foregoing ZnO powder (1) having a grain size of 1.07 μm and a specific surface area of 3.8 $m^2/g$ was used as the ZnO raw material. The raw materials were mixed so that these powders will be at a molar ratio of $In_2O_3:Ga_2O_3:ZnO=1:1:1$.

Subsequently, these powders were mixed, and additionally calcinated in the atmosphere at 1350° C. for 5 hours. The specific surface area (BET) before and after pulverization was 6.9 $m^2/g$ and 17.1 $m^2/g$, respectively. Thus, the difference was 10.2 $m^2/g$.

The results are collectively shown in Table 3. The same methods as Example 1 were conducted as to the powder mixing, pulverization, calcination, sintering and target production, and various measurements and evaluations.

Figure 4:
FIG. 4 a microstructure photograph of a target test piece shown in Example 4

Sintering was performed at 1450° C. As a result of the above, in Example 4, the maximum size of the $ZnGa_2O_4$ spinel phase (maximum grain size of the spinel phase) existing in a 90 μm×90 μm area range was less than 3 μm, and the number of $ZnGa_2O_4$ spinel phases having a grain size of 3 μm or larger was 0. These results satisfied the conditions of the present invention. The density was high at 6.36 $g/cm^3$, and the bulk resistance value was 4.4 mΩ·cm; the bulk resistance value of the target was low enough to be subject to DC sputtering. As a result of performing DC sputtering under the foregoing conditions, the number of nodules was 189 and even lower than Example 1, and it was approximately ⅓ compared with the Comparative Examples described later. Further to this, hardly any abnormal discharge was acknowledged during the sputtering. The difference with Example 3 was in that the calcination temperature was set to be higher upon performing calcination, and it has been confirmed that this is even more effective in improving the density and reducing the bulk resistance value. Even though the $ZnGa_2O_4$ spinel phases existed, the fact that they were finely dispersed is considered to be the major reason that the generation of nodules was inhibited. The micrograph of this structure is shown in FIG. 4.

Moreover, the effect of preventing the formation of the $ZnGa_2O_4$ spinel phases in the target is a result of the effect yielded by using powder in which the specific surface area of the $In_2O_3$ raw material powder is 10 $m^2/g$ or less (specific surface area of 4.4 $m^2/g$). It is considered that the generation of the $ZnGa_2O_4$ spinel phase can be effectively prevented because, in the course of the $In_2O_3$ raw material powder having a relatively large grain size and a small specific surface area being pulverized, $In_2O_3$ infiltrates other oxides, and sufficient mixing and pulverization with other oxides is achieved. This shows that the specific surface area of the $In_2O_3$ raw material powder can become the index in producing an IGZO target capable of inhibiting the generation of nodules. The foregoing results are similarly shown in Table 3.

Example 5

In Example 5, the foregoing $In_2O_3$ powder (1) having a grain size of 10.7 μm and a specific surface area of 4.4 $m^2/g$ was used as the $In_2O_3$ raw material, the foregoing $Ga_2O_3$ powder (1) having a grain size of 5.6 μm and a specific surface area of 9.1 $m^2/g$ was used as the $Ga_2O_3$ raw material, and the foregoing ZnO powder (1) having a grain size of 1.07 μm and a specific surface area of 3.8 $m^2/g$ was used as the ZnO raw material. The raw materials were mixed so that these powders will be at a molar ratio of $In_2O_3:Ga_2O_3:ZnO=1:1:1$.

Subsequently, these powders were mixed, but calcination was not performed. The specific surface area (BET) before and after pulverization was 6.0 $m^2/g$ and 17.8 $m^2/g$, respectively. Thus, the difference was 11.8 $m^2/g$.

The results are collectively shown in Table 3. The same methods as Example 1 were conducted as to the powder mixing, pulverization, calcination, sintering and target production, and various measurements and evaluations.

Figure 5:
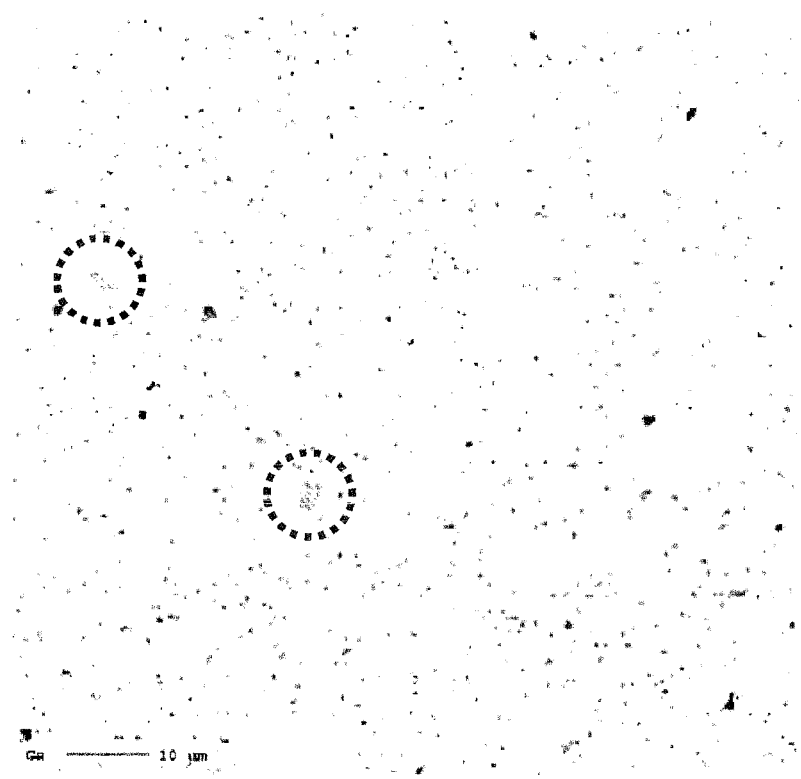
FIG. 5 a microstructure photograph of a target test piece shown in Example 5

Sintering was performed at 1450° C. As a result of the above, in Example 5, the maximum size of the $ZnGa_2O_4$ spinel phase (maximum grain size of the spinel phase) existing in a 90 μm×90 μm area range was 3.71 μm, and the number of $ZnGa_2O_4$ spinel phases having a grain size of 3 μm or larger was 7. These results satisfied the conditions of the present invention. The density was high at 6.20 $g/cm^3$, and the bulk resistance value was 2.97 mΩ·cm; the bulk resistance value of the target was low enough to be subject to DC sputtering. The micrograph of this structure is shown in FIG. 5. As a result of performing DC sputtering under the foregoing conditions, the number of nodules was 390 and rather higher than Example 1, but it was still roughly half compared with the Comparative Examples described later. Further to this, hardly any abnormal discharge was acknowledged during the sputtering. Even though the $ZnGa_2O_4$ spinel phases existed, the fact that they were finely dispersed is considered to be the major reason that the generation of nodules was inhibited.

Moreover, the effect of preventing the formation of the $ZnGa_2O_4$ spinel phases in the target is a result of the effect yielded by using powder in which the specific surface area of the $In_2O_3$ raw material powder is 10 $m^2/g$ or less (specific surface area of 4.4 $m^2/g$). It is considered that the generation of the $ZnGa_2O_4$ spinel phase can be effectively prevented because, in the course of the $In_2O_3$ raw material powder having a relatively large grain size and a small specific surface area being pulverized, $In_2O_3$ infiltrates other oxides, and sufficient mixing and pulverization with other oxides is achieved. This shows that the specific surface area of the $In_2O_3$ raw material powder can become the index in producing an IGZO target capable of inhibiting the generation of nodules. The foregoing results are similarly shown in Table 3.

Example 6

In Example 6, the foregoing $In_2O_3$ powder (1) having a grain size of 10.7 μm and a specific surface area of 4.4 m²/g was used as the $In_2O_3$ raw material, the foregoing $Ga_2O_3$ powder (2) having a grain size of 4.6 μm and a specific surface area of 11.9 m²/g was used as the $Ga_2O_3$ raw material, and the foregoing ZnO powder (1) having a grain size of 1.07 μm and a specific surface area 3.8 m²/g was used as the ZnO raw material. The raw materials were mixed so that these powders will be at a molar ratio of $In_2O_3$:$Ga_2O_3$:ZnO=1:1:2.

Subsequently, these powders were mixed, and additionally calcinated at 950° C. The specific surface area (BET) before and after pulverization was 3.1 m²/g and 14.7 m²/g, respectively. Thus, the difference was 11.6 m²/g.

The results are collectively shown in Table 3. The same methods as Example 1 were conducted as to the powder mixing, pulverization, calcination, sintering and target production, and various measurements and evaluations.

Figure 6:
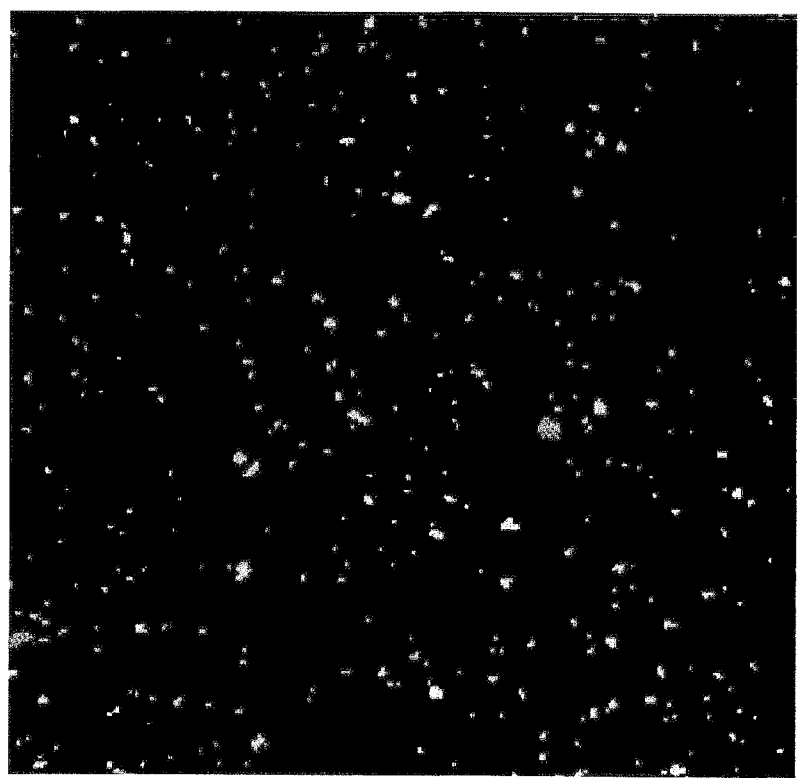
FIG. 6 a microstructure photograph of a target test piece shown in Example 6

Sintering was performed at 1450° C. As a result of the above, in Example 6, the maximum size of the $ZnGa_2O_4$ spinel phase (maximum grain size of the spinel phase) existing in a 90 μm×90 μm area range was less than 3 μm, and the number of $ZnGa_2O_4$ spinel phases having a grain size of 3 μm or larger was 0. These results satisfied the conditions of the present invention. The density was high at 6.14 g/cm³, and the bulk resistance value was slightly high at 29.0 mΩ·cm, but the value thereof was enough to be subject to DC sputtering. The micrograph of this structure is shown in FIG. 6. As a result of performing DC sputtering under the foregoing conditions, the number of nodules was 170 and even lower than Example 1. Further to this, hardly any abnormal discharge was acknowledged during the sputtering. There were few $ZnGa_2O_4$ spinel phases and, even though they existed, the fact that they were finely dispersed is considered to be the major reason that the generation of nodules was inhibited.

Moreover, the effect of preventing the formation of the $ZnGa_2O_4$ spinel phases in the target is a result of the effect yielded by using powder in which the specific surface area of the $In_2O_3$ raw material powder is 10 m²/g or less (specific surface area of 4.4 m²/g). It is considered that the generation of the $ZnGa_2O_4$ spinel phase can be effectively prevented because, in the course of the $In_2O_3$ raw material powder having a relatively large grain size and a small specific surface area being pulverized, $In_2O_3$ infiltrates other oxides, and sufficient mixing and pulverization with other oxides is achieved. This shows that the specific surface area of the $In_2O_3$ raw material powder can become the index in producing an IGZO target capable of inhibiting the generation of nodules. The foregoing results are similarly shown in Table 3.

Incidentally, the compounding ratio of powders in Example 6 was $In_2O_3$:$Ga_2O_3$:ZnO=1:1:2 and different from the ratio of powders in Example 1 which was $In_2O_3$:$Ga_2O_3$:ZnO=1:1:1, but it has been confirmed that this difference hardly affects the generation of the $ZnGa_2O_4$ spinel phases and the generation of nodules. The reason why the composition ratio of the respective elements is set according to the Formula of $In_xGa_yZn_zO_a$ {wherein $0.2 \leq x/(x+y) \leq 0.8$, $0.1 \leq z/(x+y+z) \leq 0.5$, $a=(3/2)x+(3/2)y+z$} is based on characteristics as the In—Ga—Zn—O (IGZO) series material; that is, the characteristics of a material to be used in a field-effect transistor using amorphous oxide in which the electronic carrier concentration is less than $10^{18}$/cm³. Thus, so as long as the composition ratio is within the foregoing range, based on the conditions of the present invention, it is possible to achieve the goal of inhibiting the generation of the $ZnGa_2O_4$ spinel phases and the generation of nodules.

Example 7

In Example 7, the foregoing $In_2O_3$ powder (1) having a grain size of 10.7 μm and a specific surface area of 4.4 m²/g was used as the $In_2O_3$ raw material, the foregoing $Ga_2O_3$ powder (1) having a grain size of 5.6 μm and a specific surface area of 9.1 m²/g was used as the $Ga_2O_3$ raw material, and the foregoing ZnO powder (1) having a grain size of 1.07 μm and a specific surface area of 3.8 m²/g was used as the ZnO raw material. The raw materials were mixed so that these powders will be at a molar ratio of $In_2O_3$:$Ga_2O_3$:ZnO=1:1:2.

Subsequently, these powders were mixed, and additionally calcinated at 1050° C. The specific surface area (BET) before and after pulverization was 1.8 m²/g and 11.5 m²/g, respectively. Thus, the difference was 9.7 m²/g.

The results are collectively shown in Table 3. The same methods as Example 1 were conducted as to the powder mixing, pulverization, calcination, sintering and target production, and various measurements and evaluations.

Figure 7:
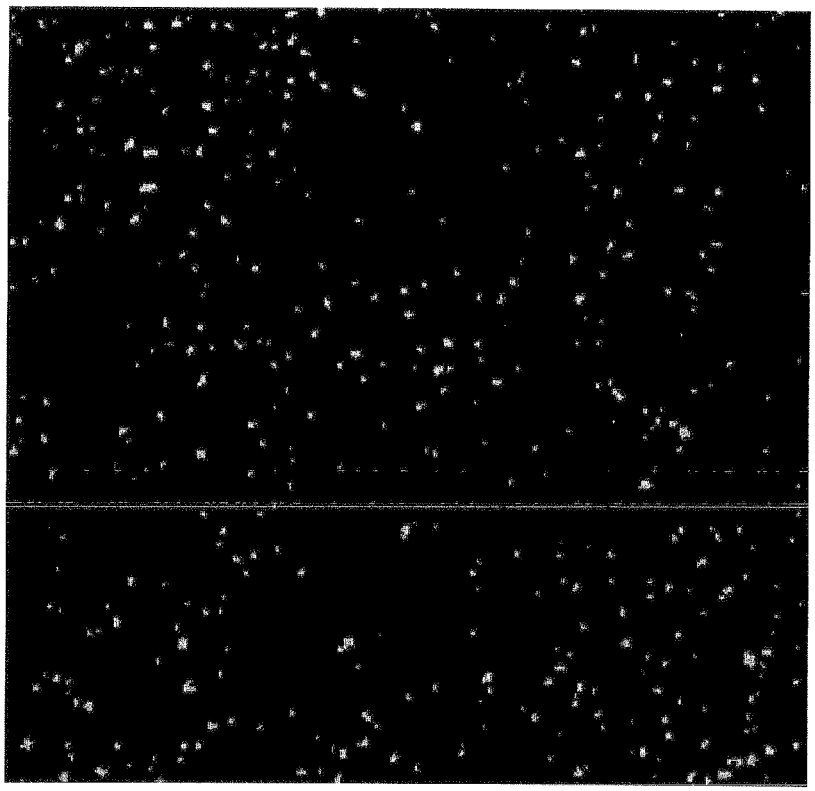
FIG. 7 a microstructure photograph of a target test piece shown in Example 7

Sintering was performed at 1490° C. As a result of the above, in Example 7, the maximum size of the $ZnGa_2O_4$ spinel phase (maximum grain size of the spinel phase) existing in a 90 μm×90 μm area range was less than 3 μm, and the number of $ZnGa_2O_4$ spinel phases having a grain size of 3 μm or larger was 0. These results satisfied the conditions of the present invention. The density was high at 6.34 g/cm³, and the bulk resistance value was slightly high at 18.0 mΩ·cm, but the value thereof was enough to be subject to DC sputtering. The micrograph of this structure is shown in FIG. 7. As a result of performing DC sputtering under the foregoing conditions, the number of nodules was 154 and even lower than Example 1. Further to this, hardly any abnormal discharge was acknowledged during the sputtering. There were few $ZnGa_2O_4$ spinel phases and, even though they existed, the fact that they were finely dispersed is considered to be the major reason that the generation of nodules was inhibited.

Moreover, the effect of preventing the formation of the $ZnGa_2O_4$ spinel phases in the target is a result of the effect yielded by using powder in which the specific surface area of the $In_2O_3$ raw material powder is 10 m²/g or less (specific surface area of 4.4 m²/g). It is considered that the generation of the $ZnGa_2O_4$ spinel phase can be effectively prevented because, in the course of the $In_2O_3$ raw material powder having a relatively large grain size and a small specific surface area being pulverized, $In_2O_3$ infiltrates other oxides, and sufficient mixing and pulverization with other oxides is achieved. This shows that the specific surface area of the $In_2O_3$ raw material powder can become the index in producing an IGZO target capable of inhibiting the generation of nodules. The foregoing results are similarly shown in Table 3.

Incidentally, the compounding ratio of powders in Example 7 was $In_2O_3$:$Ga_2O_3$:ZnO=1:1:2 and different from the compounding ratio of powders in Example 1 which was $In_2O_3$:$Ga_2O_3$:ZnO=1:1:1, but, as with Example 6, it has been confirmed that this difference hardly affects the generation of the $ZnGa_2O_4$ spinel phases and the generation of nodules. The reason why the composition ratio of the respective elements is set according to the Formula of $In_xGa_yZn_zO_a$ {wherein $0.2 \leq x/(x+y) \leq 0.8$, $0.1 \leq z/(x+y+z) \leq 50.5$, $a=(3/2)x+(3/2)y+z$} is based on characteristics as the In—Ga—Zn—O (IGZO) series material; that is, the characteristics of a material to be used in a field-effect transistor using amorphous oxide in which the electronic carrier concentration is less than $10^{18}/cm^3$. Thus, so as long as the composition ratio is within the foregoing range, based on the conditions of the present invention, it is possible to achieve the goal of inhibiting the generation of the ZnGa2O4 spinel phases and the generation of nodules.

Comparative Example 1

In Comparative Example 1, the foregoing $In_2O_3$ powder (2) having a grain size of 0.65 μm and a specific surface area of 13.7 m²/g was used as the $In_2O_3$ raw material, the foregoing $Ga_2O_3$ powder (2) having a grain size of 4.6 μm and a specific surface area of 11.1 m²/g was used as the $Ga_2O_3$ raw material, and the foregoing ZnO powder (1) having a grain size of 1.07 μm and a specific surface area of 3.8 m²/g was used as the ZnO raw material. The raw materials were mixed so that these powders will be at a molar ratio of $In_2O_3:Ga_2O_3:ZnO=1:1:1$.

Subsequently, these powders were mixed, but calcination was not performed. The specific surface area (BET) before and after pulverization was 13.8 m²/g and 22.1 m²/g, respectively. Thus, the difference was approximately 8.3 m²/g.

The results are collectively shown in Table 4. The same methods as Example 1 were conducted as to the powder mixing, pulverization, calcination, sintering and target production, and various measurements and evaluations.

Figure 8:
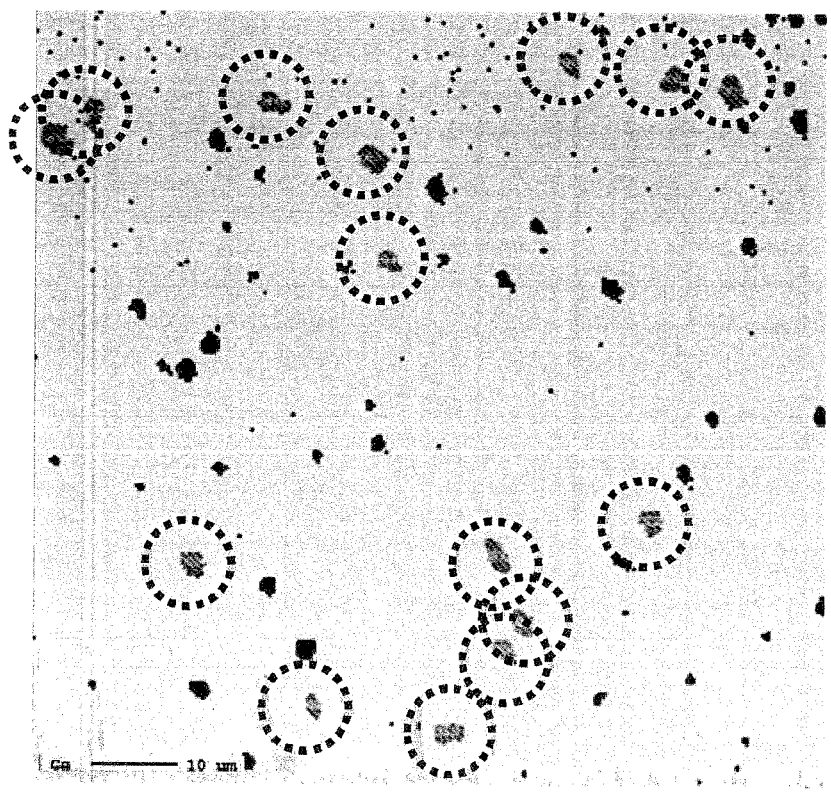
FIG. 8 a microstructure photograph of a target test piece shown in Comparative Example 1

Sintering was performed at 1400° C. As a result of the above, in Comparative Example 1, the maximum size of the $ZnGa_2O_4$ spinel phase (maximum grain size of the spinel phase) existing in a 90 μm×90 μm area range was 3.55 μM, and the number of $ZnGa_2O_4$ spinel phases having a grain size of 3 μm or larger was 15. The results did not satisfy the conditions of the present invention. The density was high at 6.48 g/cm³, and the bulk resistance value was 4.0 mΩ·cm; the value of bulk resistance of the target was low enough to be subject to DC sputtering. The micrograph of this structure is shown in FIG. 8. Nevertheless, as a result of performing DC sputtering under the foregoing conditions, the number of nodules was 531 and increased more than double compared with Example 1. Further to this, abnormal discharge during the sputtering increased. Thus, it has been confirmed that the presence of a numerous $ZnGa_2O_4$ spinel phases is a cause that cannot inhibit the generation of nodules.

Numerous $ZnGa_2O_4$ spinel phase in the target were generated, partly because powder in that the specific surface area of the $In_2O_3$ raw material powder is 10 m²/g or less (specific surface area of 4.4 m²/g) was not used, and partly because the pulverization was insufficient. The specific surface area of the $In_2O_3$ raw material powder can become the index in producing an IGZO target capable of inhibiting the generation of nodules. With the $In_2O_3$ raw material powder having a relatively small grain size and large specific surface area, it is considered without sufficient mixing and pulverization with the other oxides in the course of pulverization, it was not possible to effectively prevent the generation of the $ZnGa_2O_4$ spinel phase. The foregoing results are shown in Table 4.

TABLE 4

| | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| $In_2O_3$ raw material | (2) | (2) | (2) | (2) | (1) | (1) | (1) | (1) |
| $Ga_2O_3$ raw material | (2) | (2) | (2) | (2) | (1) | (1) | (1) | (1) |
| ZnO raw material | (1) | (1) | (1) | (1) | (1) | (1) | (1) | (1) |
| Calcination temperature (° C.) | No calcination | No calcination | 950 | 950 | 950 | No calcination | 950 | 950 |
| BET (m²/g) before pulverization | 13.8 | 13.8 | 7.0 | 7.0 | 2.6 | 7.3 | 2.7 | 2.8 |
| BET (m²/g) after pulverization | 22.1 | 22.1 | 18.1 | 18.1 | 17.0 | 9.2 | 2.7 | 4.1 |
| Sintering temperature (° C.) | 1400 | 1450 | 1400 | 1450 | 1350 | 1450 | 1450 | 1450 |
| Maximum grain size (μm) of spinel phase | 3.55 | 4.10 | 3.81 | 4.67 | 4.03 | 4.36 | — | 11.6 |
| Number of spinels | 15 | 42 | 16 | 33 | 4 | 11 | — | 1 |
| Density (g/cm³) | 6.48 | 6.44 | 6.28 | 6.51 | 5.72 | 5.92 | 5.20 | 5.66 |
| Bulk resistance value (mΩ·cm) | 4.0 | 2.6 | 4.0 | 2.9 | 7.7 | 6.2 | — | 3.2 |
| Number of nodules | 531 | 694 | 592 | 660 | 561 | 677 | — | 723 |

Comparative Example 2

In Comparative Example 2, the foregoing $In_2O_3$ powder (1) having a grain size of 0.65 μm and a specific surface area of 13.7 m²/g was used as the $In_2O_3$ raw material, the foregoing $Ga_2O_3$ powder (2) having a grain size of 4.6 μm and a specific surface area of 11.1 m²/g was used as the $Ga_2O_3$ raw material, and the foregoing ZnO powder (1) having a grain size of 1.07 μm and a specific surface area of 3.8 m²/g was used as the ZnO raw material. The raw materials were mixed so that these powders will be at a molar ratio of $In_2O_3:Ga_2O_3:ZnO=1:1:1$.

Subsequently, these powders were mixed, but calcination was not performed. The specific surface area (BET) before and after pulverization was 13.8 m²/g and 22.1 m²/g, respectively. Thus, the difference was 8.3 m²/g.

The results are collectively shown in Table 4. The same methods as Example 1 were conducted as to the powder mixing, pulverization, calcination, sintering and target production, and various measurements and evaluations.

Figure 9:
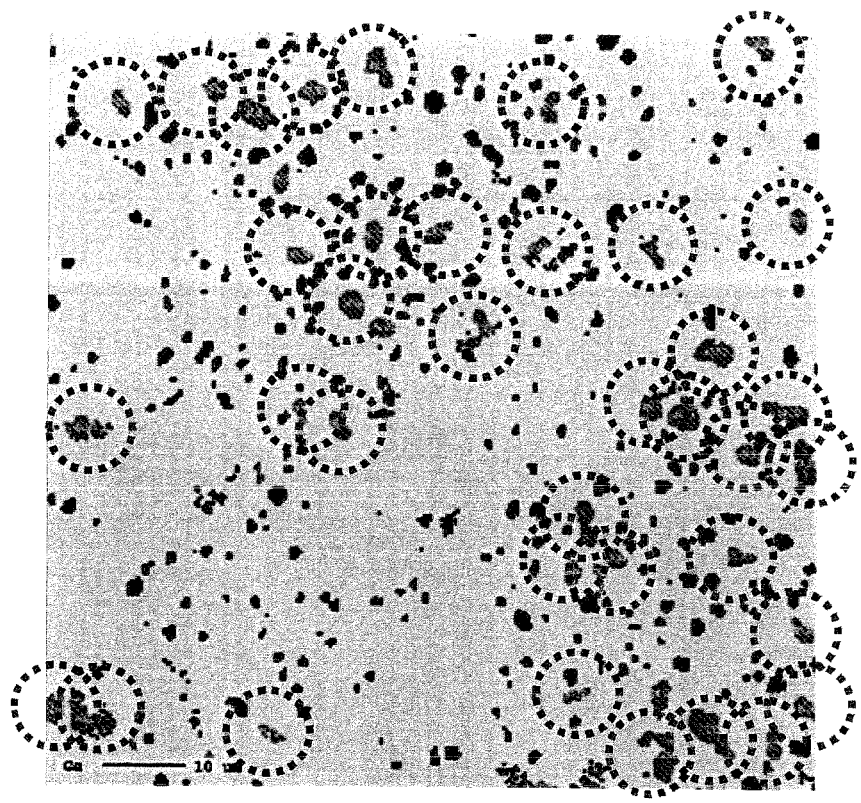
FIG. 9 a microstructure photograph of a target test piece shown in Comparative Example 2

Sintering was performed at 1450° C. As a result of the above, in Comparative Example 2, the maximum size of the $ZnGa_2O_4$ spinel phase (maximum grain size of the spinel phase) existing in a 90 μm×90 μm area range was 4.10 μm, and the number of $ZnGa_2O_4$ spinel phases having a grain size of 3 μm or larger increased to 42. These results did not satisfy the conditions of the present invention. The density was high at 6.44 g/cm³, and the bulk resistance value was 2.6 mΩ·cm; the bulk resistance value of the target was low enough to be subject to DC sputtering. The micrograph of this structure is shown in FIG. 9. Nevertheless, as a result of performing DC sputtering under the foregoing conditions, the number of nodules was 694 and increased more than triple compared with Example 1. Further to this, abnormal discharge during the sputtering increased. Thus, it has been confirmed that the presence of a numerous $ZnGa_2O_4$ spinel phases is a cause that cannot inhibit the generation of nodules.

In addition, the reason why numerous $ZnGa_2O_4$ spinel phase were generated in the target is considered to be that powder in which the specific surface area of the $In_2O_3$ raw material powder is 10 m²/g or less (specific surface area of 4.4 m²/g) was not used, and that the pulverization was insufficient. The specific surface area of the $In_2O_3$ raw material powder can become the index in producing an IGZO target capable of inhibiting the generation of nodules. Thus, with the $In_2O_3$ raw material powder having a relatively small grain size and large specific surface area, it is considered that sufficient mixing and pulverization with other oxides was unable to be achieved in the course of pulverization and that is why it was not possible to effectively prevent the generation of the $ZnGa_2O_4$ spinel phases. The foregoing results are shown in Table 4.

Comparative Example 3

In Comparative Example 3, the foregoing $In_2O_3$ powder (2) having a grain size of 0.65 μm and a specific surface area of 13.7 m²/g was used as the $In_2O_3$ raw material, the foregoing $Ga_2O_3$ powder (2) having a grain size of 4.6 μm and a specific surface area of 11.1 m²/g was used as the $Ga_2O_3$ raw material, and the foregoing ZnO powder (1) having a grain size of 1.07 μm and a specific surface area of 3.8 m²/g was used as the ZnO raw material. The raw materials were mixed so that these powders will be at a molar ratio of $In_2O_3:Ga_2O_3:ZnO=1:1:1$.

Subsequently, these powders were mixed, and additionally calcinated at a temperature of 950° C. The specific surface area (BET) before pulverization was 7.0 m²/g, and the specific surface area (BET) after pulverization was 18.1 m²/g. Thus, the difference was 11.1 m²/g.

The results are collectively shown in Table 4. The same methods as Example 1 were conducted as to the powder mixing, pulverization, calcination, sintering and target production, and various measurements and evaluations.

Figure 10:
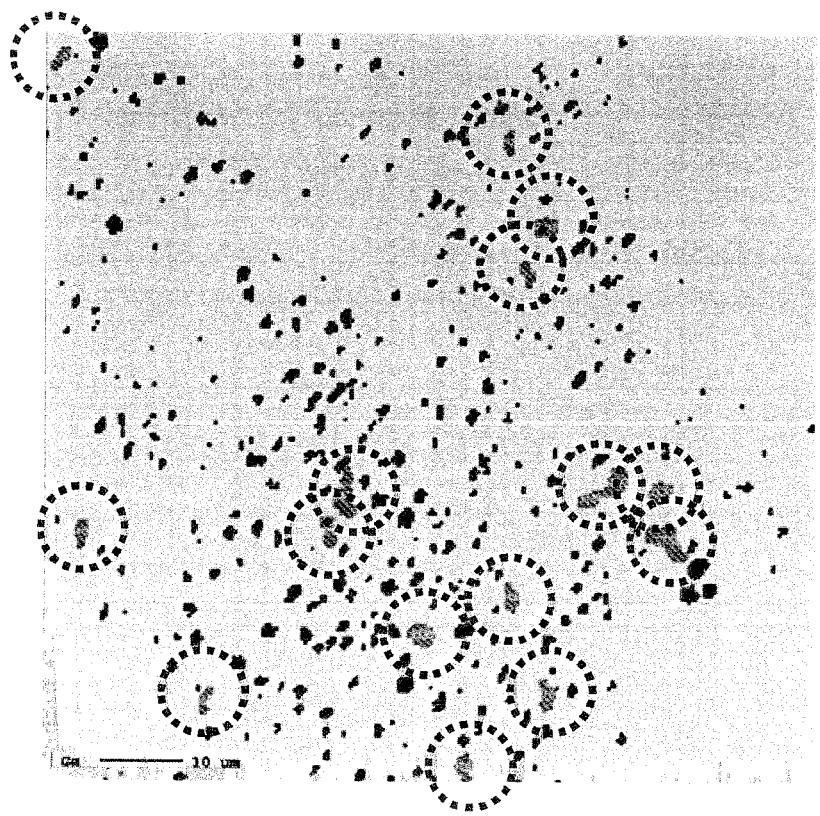
FIG. 10 a microstructure photograph of a target test piece shown in Comparative Example 3

Sintering was performed at 1400° C. As a result of the above, in Comparative Example 3, the maximum size of the $ZnGa_2O_4$ spinel phase (maximum grain size of the spinel phase) existing in a 90 μm×90 μm area range was 3.81 μm, and the number of $ZnGa_2O_4$ spinel phases having a grain size of 3 μm or larger increased to 16. These results did not satisfy the conditions of the present invention. The density was high at 6.28 g/cm³, and the bulk resistance value was 4.0 mΩ·cm; the bulk resistance value of the target was low enough to be subject to DC sputtering. The micrograph of this structure is shown in FIG. 10. Nevertheless, as a result of performing DC sputtering under the foregoing conditions, the number of nodules was 592 and increased approximately 2.5 times compared with Example 1. Further to this, abnormal discharge during the sputtering increased. Thus, it has been confirmed that the presence of a numerous $ZnGa_2O_4$ spinel phases is a cause that cannot inhibit the generation of nodules.

In addition, the reason why numerous $ZnGa_2O_4$ spinel phase were generated in the target is considered to be that powder in which the specific surface area of the $In_2O_3$ raw material powder is 10 m²/g or less (specific surface area of 4.4 m²/g) was not used, and that the pulverization was insufficient. The specific surface area of the $In_2O_3$ raw material powder can become the index in producing an IGZO target capable of inhibiting the generation of nodules. Thus, with the $In_2O_3$ raw material powder having a relatively small grain size and large specific surface area, it is considered that sufficient mixing and pulverization with other oxides was unable to be achieved in the course of pulverization and that is why it was not possible to effectively prevent the generation of the $ZnGa_2O_4$ spinel phases. The foregoing results are shown in Table 4.

Comparative Example 4

In Comparative Example 4, the foregoing $In_2O_3$ powder (2) having a grain size of 0.65 μm and a specific surface area of 13.7 m²/g was used as the $In_2O_3$ raw material, the foregoing $Ga_2O_3$ powder (2) having a grain size of 4.6 μm and a specific surface area of 11.1 m²/g was used as the $Ga_2O_3$ raw material, and the foregoing ZnO powder (1) having a grain size of 1.07 μm and a specific surface area of 3.8 m²/g was used as the ZnO raw material. The raw materials were mixed so that these powders will be at a molar ratio of $In_2O_3:Ga_2O_3:ZnO=1:1:1$.

Subsequently, these powders were mixed, and additionally calcinated at a temperature of 950° C. The specific surface area (BET) before and after pulverization was 7.0 m²/g and 18.1 m²/g, respectively. Thus, the difference was 11.1 m²/g.

The results are collectively shown in Table 4. The same methods as Example 1 were conducted as to the powder mixing, pulverization, calcination, sintering and target production, and various measurements and evaluations.

Figure 11:
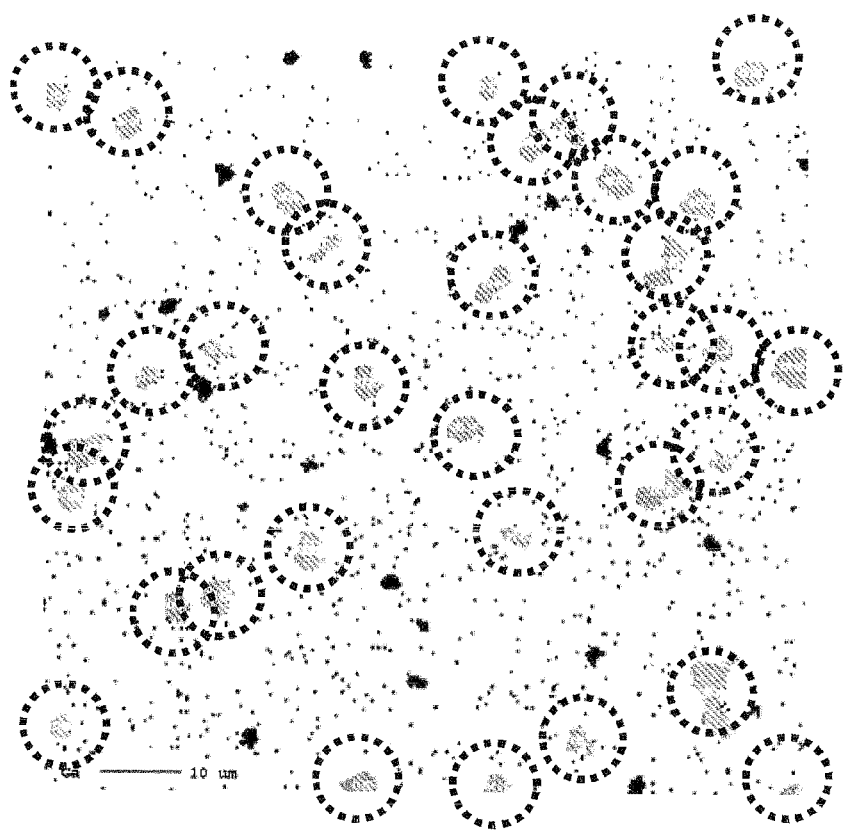
FIG. 11 a microstructure photograph of a target test piece shown in Comparative Example 4

Sintering was performed at 1450° C. As a result of the above, in Comparative Example 4, the maximum size of the $ZnGa_2O_4$ spinel phase (maximum grain size of the spinel phase) existing in a 90 μm×90 μm area range was 4.67 μm, and the number of $ZnGa_2O_4$ spinel phases having a grain size of 3 μm or larger increased considerably to 33. These results did not satisfy the conditions of the present invention. The density was high at 6.51 g/cm³, and the bulk resistance value was 2.9 mΩ·cm; the bulk resistance value of the target was low enough to be subject to DC sputtering. The micrograph of this structure is shown in FIG. 11. Nevertheless, as a result of performing DC sputtering under the foregoing conditions, the number of nodules was 660 and increased roughly triple compared with Example 1. Further to this, abnormal discharge during the sputtering increased. Thus, it has been confirmed that the presence of a numerous $ZnGa_2O_4$ spinel phases is a cause that cannot inhibit the generation of nodules.

In addition, the reason why numerous $ZnGa_2O_4$ spinel phase were generated in the target is considered to be that powder in which the specific surface area of the $In_2O_3$ raw material powder is 10 m²/g or less (specific surface area of 4.4 m²/g) was not used, and that the pulverization was insufficient. The specific surface area of the $In_2O_3$ raw material powder can become the index in producing an IGZO target capable of inhibiting the generation of nodules. Thus, with the $In_2O_3$ raw material powder having a relatively small grain size and large specific surface area, it is considered that sufficient mixing and pulverization with other oxides was unable to be achieved in the course of pulverization and that is why it was not possible to effectively prevent the generation of the $ZnGa_2O_4$ spinel phases. The foregoing results are shown in Table 4.

Comparative Example 5

In Comparative Example 5, the foregoing $In_2O_3$ powder (1) having a grain size of 10.7 μm and a specific surface area of 4.4 m²/g was used as the $In_2O_3$ raw material, the foregoing $Ga_2O_3$ powder (1) having a grain size of 5.6 μm and a specific surface area of 9.1 m²/g was used as the $Ga_2O_3$ raw material, and the foregoing ZnO powder (1) having a grain size of 1.07 μm and a specific surface area of 3.8 m²/g was used as the ZnO raw material. The raw materials were mixed so that these powders will be at a molar ratio of $In_2O_3:Ga_2O_3:ZnO=1:1:1$.

Subsequently, these powders were mixed, and additionally calcinated at a temperature of 950° C. The specific surface area (BET) before and after pulverization was 2.6 m$^2$/g and 17.0 m$^2$/g, respectively. Thus, the difference was 14.4 m$^2$/g.

The results are collectively shown in Table 4. The same methods as Example 1 were conducted as to the powder mixing, pulverization, calcination, sintering and target production, and various measurements and evaluations.

Figure 12:
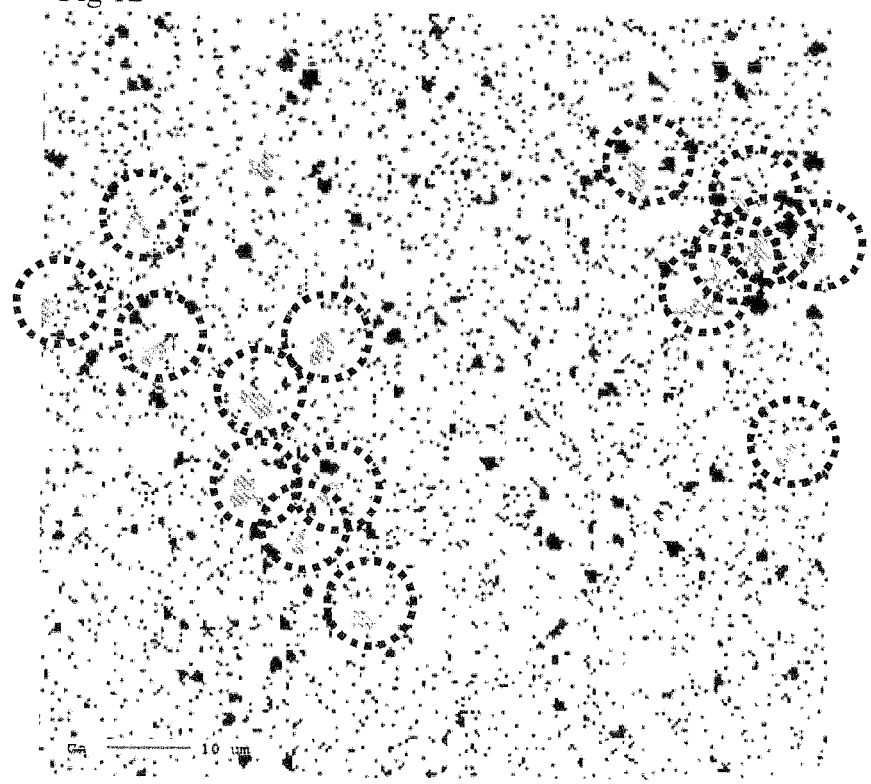
FIG. 12 a microstructure photograph of a target test piece shown in Comparative Example 5

Sintering was performed at 1350° C. As a result of the above, in Comparative Example 5, the maximum size of the ZnGa$_2$O$_4$ spinel phase (maximum grain size of the spinel phase) existing in a 90 μm×90 μm area range was 4.03 μm, and the number of ZnGa$_2$O$_4$ spinel phases having a grain size of 3 μm or larger was 4. Although the existence of these spinel phases satisfied the conditions of the present invention, since the sintering temperature was low, the density decreased considerably to 5.72 g/cm$^3$, and the bulk resistance value also increased to 7.7 mΩ·cm. Still, it was possible to perform DC sputtering using the target. The micrograph of this structure is shown in FIG. 12. Nevertheless, as a result of performing DC sputtering under the foregoing conditions, the number of nodules was 561 and increased roughly 2.5 times compared with Example 1. Further to this, abnormal discharge during the sputtering increased. Thus, it has been confirmed that the presence of a numerous ZnGa$_2$O$_4$ spinel phases is a cause that cannot inhibit the generation of nodules.

In addition, the reason why numerous ZnGa$_2$O$_4$ spinel phase were generated in the target is considered to be that powder in which the specific surface area of the In$_2$O$_3$ raw material powder is 10 m$^2$/g or less (specific surface area of 4.4 m$^2$/g) was not used, and the pulverization was insufficient. The specific surface area of the In$_2$O$_3$ raw material powder can become the index in producing an IGZO target capable of inhibiting the generation of nodules. Thus, with the In$_2$O$_3$ raw material powder having a relatively small grain size and large specific surface area, it is considered that sufficient mixing and pulverization with other oxides was unable to be achieved in the course of pulverization and that is why it was not possible to effectively prevent the generation of the ZnGa$_2$O$_4$ spinel phases. The foregoing results are shown in Table 4.

Comparative Example 6

In Comparative Example 6, the foregoing In$_2$O$_3$ powder (1) having a grain size of 10.7 μm and a specific surface area of 4.4 m$^2$/g was used as the In$_2$O$_3$ raw material, the foregoing Ga$_2$O$_3$ powder (1) having a grain size of 5.6 μm and a specific surface area of 9.1 m$^2$/g was used as the Ga$_2$O$_3$ raw material, and the ZnO powder (1) having a grain size of 1.07 μm and a specific surface area of 3.8 m$^2$/g was used as the ZnO raw material. The raw materials were mixed so that these powders will be at a molar ratio of In$_2$O$_3$:Ga$_2$O$_3$:ZnO=1:1:1.

Subsequently, these powders were mixed, but calcination was not performed. The specific surface area (BET) before and after pulverization was 7.3 m$^2$/g and 9.2 m$^2$/g, respectively. Thus, the difference was 1.9 m$^2$/g.

The results are collectively shown in Table 4. The same methods as Example 1 were conducted as to the powder mixing, pulverization, calcination, sintering and target production, and various measurements and evaluations.

Figure 13:
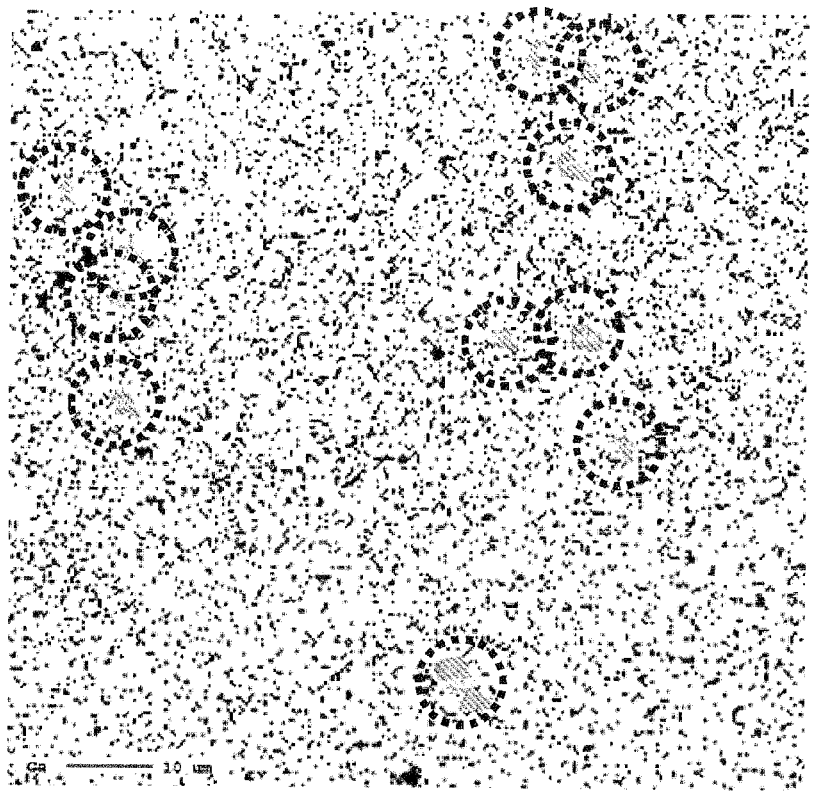
FIG. 13 a microstructure photograph of a target test piece shown in Comparative Example 6

Sintering was performed at 1450° C. As a result, in Comparative Example 6, the maximum size of the ZnGa$_2$O$_4$ spinel phase (maximum grain size of the spinel phase) existing in a 90 μm×90 μm area range was 4.36 μm, and the number of ZnGa$_2$O$_4$ spinel phases having a grain size of 3 μm or larger was 11. The existence of these spinel phases did not satisfy the conditions of the present invention. The density decreased considerably to 5.92 g/cm$^3$. The bulk resistance value was so low at 6.2 mΩ·cm that it was possible to perform DC sputtering. The micrograph of this structure is shown in FIG. 13. Nevertheless, as a result of performing DC sputtering under the foregoing conditions, the number of nodules was 667 and increased roughly triple compared with Example 1. Further to this, abnormal discharge during the sputtering increased. Thus, it has been confirmed that the presence of a numerous ZnGa$_2$O$_4$ spinel phases is a cause that cannot inhibit the generation of nodules.

In addition, the reason that numerous ZnGa$_2$O$_4$ spinet phase were generated in the target is considered to be because the difference between the specific surface area (BET) before pulverization of 7.3 m$^2$/g and after pulverization of 9.2 m$^2$/g was 1.9 m$^2$/g, which is caused by insufficient mixing and pulverization. This is considered to be because, since the mixed powder was not calcinated, the pulverization was insufficient.

The specific surface area of the In$_2$O$_3$ raw material powder can become the index in producing an IGZO target capable of inhibiting the generation of nodules. Thus, even when using the In$_2$O$_3$ raw material powder having a relatively large grain size and small specific surface area, if the powder is not subject to sufficient pulverization, it is considered that sufficient mixing and pulverization with other oxides could not be achieved in the course of pulverization and that is why it was not possible to effectively prevent the generation of the ZnGa$_2$O$_4$ spinet phases. The foregoing results are shown in Table 4.

Comparative Example 7

In Comparative Example 7, the foregoing In$_2$O$_3$ powder (1) having a grain size of 10.7 μm and a specific surface area of 4.4 m$^2$/g was used as the In$_2$O$_3$ raw material, the foregoing Ga$_2$O$_3$ powder (1) having a grain size of 5.6 μm and a specific surface area of 9.1 m$^2$/g was used as the Ga$_2$O$_3$ raw material, and the foregoing ZnO powder (1) having a grain size of 1.07 μm and a specific surface area of 3.8 m$^2$/g was used as the ZnO raw material. The raw materials were mixed so that these powders will be at a molar ratio of In$_2$O$_3$:Ga$_2$O$_3$:ZnO=1:1:1.

Subsequently, these powders were mixed, and additionally calcinated at a temperature of 950° C. The powders were mixed, but were not pulverized. Thus, the specific surface area (BET) of the powder was 2.7 m$^2$/g and did not change, and the difference thereof was 0. The foregoing results are collectively shown in Table 4. The same methods as Example 1 were conducted as to the powder mixing, pulverization, calcination, sintering and target production, and various measurements and evaluations.

Sintering was performed at 950° C. However, sintering was not performed sufficiently, and the density decreased considerably to 5.20 g/cm$^3$. Thus, the observance of the structure and other evaluations were not conducted since they would be meaningless. The foregoing results are similarly shown in Table 4.

Comparative Example 8

In Comparative Example 8, the foregoing In$_2$O$_3$ powder (1) having a grain size of 10.7 μm and a specific surface area of 4.4 m$^2$/g was used as the In$_2$O$_3$ raw material, the foregoing Ga$_2$O$_3$ powder (1) having a grain size of 5.6 μm and a specific surface area of 9.1 m$^2$/g was used as the Ga$_2$O$_3$ raw material, and the foregoing ZnO powder (1) having a grain size of 1.07 μm and a specific surface area of 3.8 m$^2$/g was used as the ZnO raw material. The raw materials were mixed so that these powders will be at a molar ratio of $In_2O_3:Ga_2O_3:ZnO=1:1:1$.

Subsequently, these powders were mixed, and additionally calcinated at a temperature of 950° C. The specific surface area (BET) before and after pulverization was 2.8 m$^2$/g and 4.1 m$^2$/g, respectively. Thus, the difference was 1.3 m$^2$/g.

The results are collectively shown in Table 4. The same methods as Example 1 were conducted as to the powder mixing, pulverization, calcination, sintering and target production, and various measurements and evaluations.

Figure 14:
FIG. 14 a microstructure photograph of a target test piece shown in Comparative Example 8

Sintering was performed at 1450° C. As a result of the above, in Comparative Example 8, the maximum size of the $ZnGa_2O_4$ spinel phase (maximum grain size of the spinel phase) existing in a 90 μm×90 μm area range was 11.6 μm, and an extremely large sized phase was confirmed. The number of $ZnGa_2O_4$ spinel phases having a grain size of 3 μm or larger was 1. The existence of these spinel phases did not satisfy the conditions of the present invention. The density decreased considerably to 5.66 g/cm$^3$. Since the bulk resistance value was 3.2 mΩ·cm, the value of the target was possible to subject to DC sputtering. The micrograph of this structure is shown in FIG. 14. Nevertheless, as a result of performing DC sputtering under the foregoing conditions, the number of nodules was 723 and increased roughly 3.5 times compared with Example 1. Further to this, abnormal discharge during the sputtering increased. Thus, it has been confirmed that the presence of an enormous $ZnGa_2O_4$ spinel phase is a cause that cannot inhibit the generation of nodules.

In addition, the reason why numerous $ZnGa_2O_4$ spinel phase were generated in the target is considered to be that the pulverization was insufficient, and that the difference between the specific surface area (BET) before pulverization of 2.8 m$^2$/g and after pulverization of 4.1 m$^2$/g was small at 1.3 m$^2$/g.

Although the specific surface area of the $In_2O_3$ raw material powder is important, it has also been confirmed that the difference of the specific surface area (BET) before and after pulverization could also become an index for producing an IGZO target capable of inhibiting the generation of nodules. Thus, it is considered that sufficient mixing and pulverization with other oxides was unable to be achieved in the course of pulverization and that is why it was not possible to effectively prevent the generation of the ZnGa2O4 spinel phases. The foregoing results are in Table 4.

The present invention is directed to reduce the $ZnGa_2O_4$ (spinel) phases in the target structure by optimizing the raw material characteristics and production method. As a result of using $In_2O_3$ having a specific surface area smaller than 10 m$^2$/g, it is possible to inhibit the $ZnGa_2O_4$ (spinel) phase; the enlargement and the presence of numerous $ZnGa_2O_4$ (spinel) phases, which have different characteristics from the $In_xGa_yZn_zO_a$ phase as the main phase, cause the generation of nodules. Reducing the amount of nodules generated can inhibit the abnormal discharge during the sputtering. Also, the present invention is able to improve the density by pulverizing the raw material to obtain a target having stable quality and structure, and conductivity that allows for DC sputtering.

Based on the above, the present invention yields a significant effect of being able to reduce the particles and nodules in the sputtering process and additionally prolong the target durability, reduce the variation in quality, and improve productivity. Specifically, the present invention can be used as a sputtering target for forming layers. Since this In—Ga—Zn—O (IGZO) series material is able to obtain amorphous oxide in which the electronic carrier concentration is less than 10$^{18}$/cm$^3$, it is useful in a field-effect transistor. Moreover, since the IGZO target can be applied to various types of usage without trouble, the industrial utility value of the present invention is high.

The invention claimed is:

1. A sintered oxide compact target for sputtering comprising indium (In), gallium (Ga), zinc (Zn), oxygen (O) and unavoidable impurities, wherein the sintered oxide compact target has a structure made of a plurality of oxides with each of the oxides including one or more of In, Ga, and Zn, wherein the sintered oxide compact sputtering target has a plurality of fine $ZnGa_2O_4$ spinel phases dispersed therein such that the number of $ZnGa_2O_4$ spinel phases having a grain size of 3 μm or larger existing in a 90 μm×90 μm area range of the sintered oxide compact target is 10 or less, and wherein the sintered oxide compact target has a density of 6.0 g/cm$^3$ or more.

2. The sintered oxide compact target for sputtering according to claim 1, wherein a maximum grain size of the $ZnGa_2O_4$ spinel phases existing in a 90 μm×90 μm area range of the sintered oxide compact target is 5 μm or less.

3. The sintered oxide compact target for sputtering according to claim 2, wherein a bulk resistance value of the target is 5.0×10$^{-2}$Ω·cm or less.

4. The sintered oxide compact sputtering target according to claim 1, wherein the sintered oxide compact sputtering target has a bulk resistance value of 5.0×10$^{-2}$Ω·cm or less.

5. The sintered oxide compact sputtering target according to claim 1, wherein the In, Ga, Zn, and O constituting the sintered oxide compact sputtering target are in a mole ratio of In:Ga:Zn:O represented as x:y:z:a, where x, y, z, and a satisfy relations expressed as 0.2≤x/(x+y)≤0.8, 0.1≤z/(x+y+z)≤0.5, and a=(3/2)x+(3/2)y+z.

* * * * *